United States Patent  
Hartmann et al.

(10) Patent No.: US 9,431,376 B2  
(45) Date of Patent: Aug. 30, 2016

(54) SUBSTRATE FOR MOUNTING MULTIPLE POWER TRANSISTORS THEREON AND POWER SEMICONDUCTOR MODULE

(71) Applicant: ABB TECHNOLOGY AG, Zürich (CH)

(72) Inventors: Samuel Hartmann, Staufen (CH); Dominik Trüssel, Bremgarten (CH)

(73) Assignee: ABB Technology AG, Zurich (CH)

( * ) Notice: Subject to any disclaimer, the term of this patent is extended or adjusted under 35 U.S.C. 154(b) by 0 days.

(21) Appl. No.: 14/539,422

(22) Filed: Nov. 12, 2014

(65) Prior Publication Data

US 2015/0069463 A1    Mar. 12, 2015

Related U.S. Application Data

(63) Continuation of application No. PCT/EP2013/061735, filed on Jun. 6, 2013.

(30) Foreign Application Priority Data

Jun. 19, 2012    (EP) .................................... 12172514

(51) Int. Cl.
*H01L 23/00*    (2006.01)
*H01L 25/07*    (2006.01)

(52) U.S. Cl.
CPC ............. *H01L 25/072* (2013.01); *H01L 24/49* (2013.01); *H01L 2224/0603* (2013.01);
(Continued)

(58) Field of Classification Search
CPC ................. H01L 24/49; H01L 25/072; H01L 2224/45014; H01L 27/067; H01L 25/18; H01L 23/04; H01L 23/24; H01L 25/45; H01L 24/06; H01L 24/48; H01L 27/08; H01L 2224/49111; H02M 7/003; H02M 7/487; H03K 17/691
See application file for complete search history.

(56) References Cited

U.S. PATENT DOCUMENTS 5,164,877 A    11/1992    Furuhata et al.
5,471,089 A *  11/1995    Nagatomo et al. ........... 257/691
(Continued)

FOREIGN PATENT DOCUMENTS

DE    195 49 011 A1    7/1997
EP    0 455 322 A1    11/1991
(Continued)

OTHER PUBLICATIONS

International Search Report (PCT/ISA/210) mailed on Jul. 22, 2013, by the European Patent Office as the International Searching Authority for International Application No. PCT/EP2013/061735.
(Continued)

*Primary Examiner* — Jarrett Stark
*Assistant Examiner* — Bitew Dinke
(74) *Attorney, Agent, or Firm* — Taft Stettinius & Hollister LLP

(57) ABSTRACT

Exemplary embodiments provide a substrate for mounting multiple power transistors. The substrate has a first metallization on which the power transistors are mountable with an associated collector or emitter, and which extends in at least one line on the substrate. A second metallization extends in an area next to the at least one line of the first metallization, for connection to the remaining ones of the emitters or collectors of the power transistors. A third metallization allows connection to gate contact pads of the power transistors. The third metallization includes a gate contact and at least two gate metallization areas, which are interconnectable. The gate metallization areas are arranged in parallel to the at least one line and spaced apart in a longitudinal direction of the at least one line. At least one gate metallization area is provided as a gate island surrounded on the substrate by the second metallization.

14 Claims, 5 Drawing Sheets

(52) U.S. Cl.
CPC .............. *H01L 2224/45014* (2013.01); *H01L 2224/48101* (2013.01); *H01L 2224/48157* (2013.01); *H01L 2224/48227* (2013.01); *H01L 2224/49111* (2013.01); *H01L 2224/49113* (2013.01); *H01L 2224/49171* (2013.01); *H01L 2224/49431* (2013.01); *H01L 2924/00014* (2013.01); *H01L 2924/1305* (2013.01); *H01L 2924/13055* (2013.01); *H01L 2924/19107* (2013.01); *H01L 2924/3025* (2013.01); *H01L 2924/30107* (2013.01)

(56) References Cited

U.S. PATENT DOCUMENTS

| | | | | |
|---|---|---|---|---|
| 5,616,955 | A * | 4/1997 | Yamada et al. | 257/690 |
| 5,767,579 | A * | 6/1998 | Kanazawa et al. | 257/717 |
| 6,939,743 | B2 * | 9/2005 | Frey | 438/117 |
| 7,973,405 | B2 * | 7/2011 | Takahashi et al. | 257/724 |
| 2002/0018353 | A1* | 2/2002 | Mourick | 363/131 |
| 2008/0042164 | A1* | 2/2008 | Kanschat | 257/133 |
| 2010/0244092 | A1* | 9/2010 | Ishikawa et al. | 257/140 |
| 2012/0199989 | A1* | 8/2012 | Schulz et al. | 257/782 |
| 2012/0320645 | A1* | 12/2012 | Fujino et al. | 363/123 |
| 2013/0093046 | A1* | 4/2013 | Bayerer et al. | 257/532 |
| 2013/0292739 | A1* | 11/2013 | Hartmann et al. | 257/139 |

FOREIGN PATENT DOCUMENTS

| | | | |
|---|---|---|---|
| WO | WO 2011118057 | A1 * | 9/2011 |
| WO | WO 2012039114 | A1 * | 3/2012 |

OTHER PUBLICATIONS

European Search Report mailed on Mar. 1, 2013, by the European Patent Office in corresponding European Patent Application No. 12172514.7-1552.

International Preliminary Report on Patentability and the Written Opinion of the International Searching Authority (Forms PCT/IB/373 and PCT/ISA/237) issued on Dec. 23, 2014, by the International Bureau of WIPO in corresponding International Patent Application No. PCT/EP2013/061735. (6 pages).

\* cited by examiner

US 9,431,376 B2

SUBSTRATE FOR MOUNTING MULTIPLE POWER TRANSISTORS THEREON AND POWER SEMICONDUCTOR MODULE

RELATED APPLICATION(S)

This application claims priority under 35 U.S.C. §120 to International application PCT/EP2013/061735 filed on Jun. 6, 2013, designating the U.S., and claiming priority to European application EP 12172514.7 filed in Europe on Jun. 19, 2012. The entire content of each prior application is hereby incorporated by reference.

FIELD

The present disclosure relates to the area of substrates for mounting multiple power transistors thereon and of power semiconductor modules including such substrates and power transistors.

BACKGROUND INFORMATION

Power semiconductor modules are used in high power applications to switch high voltages and currents and comprise multiple power semiconductors. Because each single semiconductor can have a maximum voltage and current, the power semiconductors have to be combined in parallel and/or in series within the power semiconductor modules to enable use in high power applications. To facilitate the manufacturing of such modules they commonly include (e.g., comprise) multiple substrates, on which the power semiconductors are mounted. The substrates are provided with common contacts for emitter, collector and base, so that the substrates can easily be connected within the power semiconductor modules.

FIG. 1 shows a schematic drawing of a substrate with multiple power transistors mounted thereon according to a known implementation. The substrate 1 includes a first metallization 3 which extends in two interconnected lines 5 extending along opposite edges 7 of the substrate 1. A second metallization 9 extends in an area 11 between the two lines 5 of the first metallization 3. The substrate 1 further includes a third metallization 13 with a gate contact 15 and a gate area 17, which are interconnected by means of a bonding wire 19. The gate area 17 of the third metallization 13 extends in the area 11 between the two lines 5 of the first metallization 3, thereby dividing the second metallization 9 in two legs 20. As can be seen in FIG. 1, multiple RC-IGBTs 21 are commonly mounted with their collectors on the first metallization 3. Emitter pads 23 of the RC-IGBTs 21 are bonded by means of bonding wires 19 to the second metallization 9, and gate pads 25 of the RC-IGBTs 21 are each bonded by means of a single bonding wire 19 to the third metallization 13.

The substrates can be mounted on a common base plate, which can be part of a housing of the power semiconductor module or which can be held within a housing of the power semiconductor module. Known power semiconductor modules, can be arranged such that four or six substrates are combined, each substrate being provided with four to six power semiconductors including power transistors like insulated gate bipolar transistors (IGBT) or reverse conducting insulated gate bipolar transistors (RC-IGBT), power diodes, or other power semiconductors suitable for high power applications. For example, a substrate can include four IGBTs and two power diodes.

Important characteristics of a power semiconductor module are size, heat generation, cooling and maximum power. To facilitate the use of power semiconductor modules, it is desired to provide modules with a compact size, which can involve little space for mounting, and which are capable of use with high currents.

DE 195 49 011 A1 discloses a substrate for mounting multiple power transistors thereon, with a first, second and third metallization. Furthermore, US 2002/0018353 A1 discloses a low-inductance circuit arrangement with two parallel metallizations with power transistors having the same orientation mounted thereon. Moreover, EP 0 455 322 A1 shows a semiconductor device with island-like gate metallization areas.

SUMMARY

An exemplary substrate is disclosed comprising: multiple power transistors mounted thereon; a first metallization, on which the power transistors are commonly mountable with their collector or emitter, and which extends in at least one line on the substrate; a second metallization, which extends in an area next to the at least one line of the first metallization, for connection to other ones of the emitters or collectors of the power transistors; a third metallization for connection to gate contact pads of the power transistors, wherein the third metallization includes at least two gate metallization areas, which are interconnectable through bonding means, whereby the gate metallization areas are arranged in parallel to the at least one line and spaced apart in a longitudinal direction of the at least one line; at least one gate metallization area is provided as a gate island surrounded on the substrate by the second metallization, wherein the second metallization is adapted for mounting multiple power transistors with their collectors or emitters thereon, whereby the power transistors have the same orientation like the power transistors mounted on the first metallization, a fourth metallization, which extends in an area next to the second metallization, for connection to the other ones of the emitters or collectors of the power transistors mountable on the second metallization, a fifth metallization for connection to gate contact pads of the power transistors mountable on the second metallization, wherein the fifth metallization includes at least two gate metallization areas, which are interconnectable by way of bonding means, and the at least two gate metallization areas are arranged in parallel to the at least one line and spaced apart in a longitudinal direction of the at least one line, and at least one gate metallization area is provided as a gate island surrounded on the substrate by the fourth metallization.

BRIEF DESCRIPTION OF THE DRAWINGS

These and other aspects of the disclosure will be apparent from and elucidated with reference to the exemplary embodiments described hereinafter.

In the drawings.

DETAILED DESCRIPTION

Figure 1:
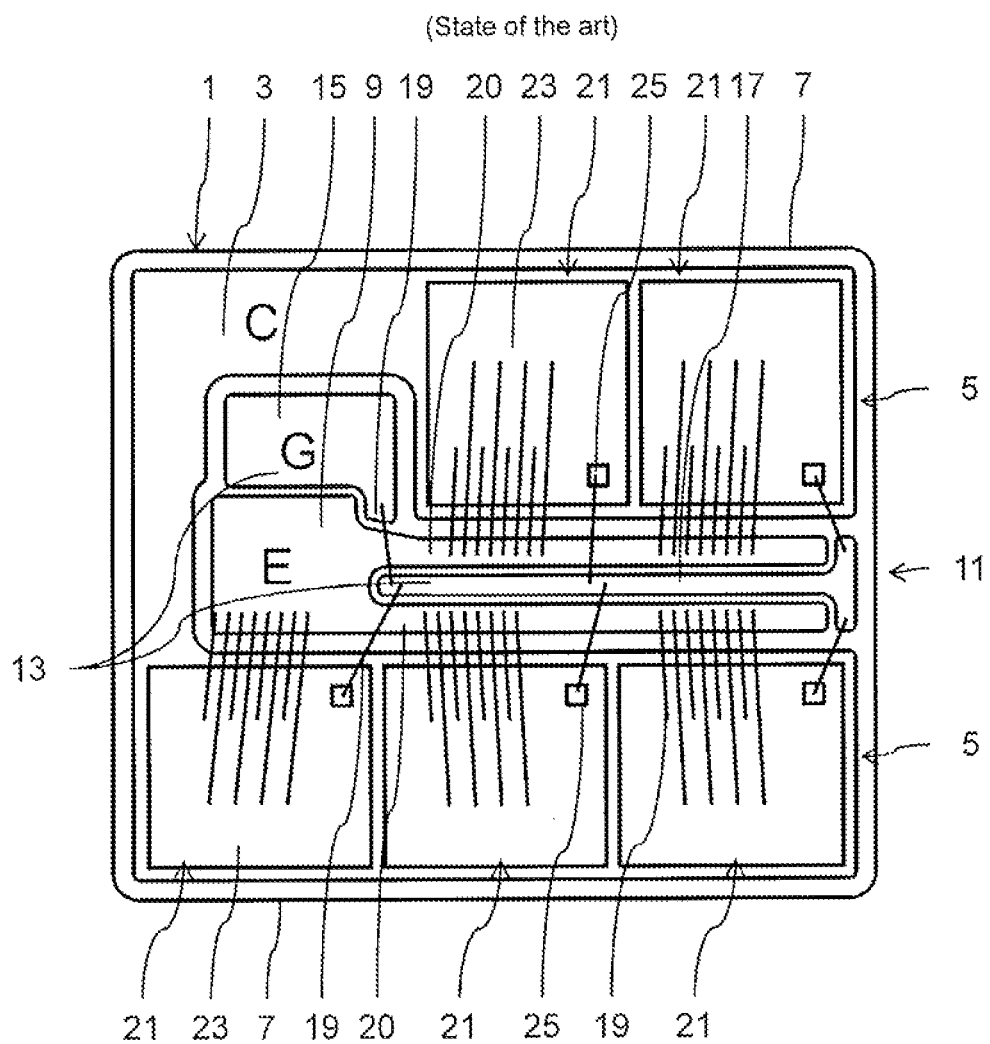
FIG. 1 shows a schematic drawing of a substrate with multiple power transistors mounted thereon according to a known implementation.

Exemplary embodiments of the present disclosure provide a substrate and a power semiconductor module of the above-mentioned kind which are suitable for use in high power applications with high currents, which have a small size, and which are easily and economically mountable.

An exemplary embodiment of the present disclosure provides an exemplary substrate for mounting multiple power transistors thereon, including a first metallization, on which the power transistors are commonly mountable with their collector or emitter, and which extends in at least one line on the substrate, a second metallization, which extends in an area next to the at least one line of the first metallization, for connection to the remaining (e.g., other) ones of the emitters or collectors of the power transistors, and a third metallization for connection to gate contact pads of the power transistors, whereby the third metallization includes a gate contact and at least two gate metallization areas, which are interconnectable by way of bonding means, whereby the gate metallization areas are arranged in parallel to the at least one line and spaced apart in a longitudinal direction of the at least one line, and at least one gate metallization area is provided as a gate island surrounded on the substrate by the second metallization.

An exemplary embodiment of the present disclosure also provides a power semiconductor module including at least one of the above substrates, whereby multiple power transistors are commonly mounted with their collectors or emitters on the first metallization of the at least one substrate, the remaining ones of the emitters or collectors of the power transistors are connected to the second metallization, gate pads of the power transistors are connected to the third metallization, and the gate contact and the at least two gate metallization areas are interconnected by way of bonding means.

Exemplary embodiments of the present disclosure provide the gate metallization with at least one gate island within the second metallization, so that an effective width of the second metallization is increased for the power semiconductors mountable on the substrate. Accordingly, current can flow from the power semiconductors over the entire width of the second metallization, so that the substrate can be used for high maximum currents. The gate metallization areas can be provided having a small extension within the second metallization, so that almost no extra space is involved on the substrate, and the substrate can be kept small. Furthermore, space of the second metallization can be increased for connecting bonding means. An inductivity of the current power path, which includes the second metallization, is reduced due to the increased width of the second metallization. With the gate island surrounded by the second metallization, an equilibrated coupling of the load current into the gate signals can be achieved. The bonding of gate pads of the power transistors can be easily realized by a suitable placement of the gate metallization areas, so that also the bonding of the second metallization to the power semiconductors can be improved.

According to another exemplary embodiment of the disclosure, the second metallization is adapted for commonly mounting multiple power transistors with their collectors or emitters thereon, whereby the power transistors have the same orientation like the power transistors mounted on the first metallization, the substrate includes a fourth metallization, which extends in an area next to the second metallization, for connection to the remaining (e.g., other) ones of the emitters or collectors of the power transistors mountable on the second metallization, and a fifth metallization for connection to gate contact pads of the power transistors mountable on the second metallization, whereby the fifth metallization includes a gate contact and at least two gate metallization areas, which are interconnectable by way of bonding means, the gate metallization areas are arranged in parallel to the at least one line and spaced apart in a longitudinal direction of the at least one line, and at least one gate metallization area is provided as a gate island surrounded on the substrate by the fourth metallization.

This arrangement provides a substrate for power semiconductors, which are mountable in series. Accordingly, the second metallization can have a size for mounting the power transistors thereon. The same principles applicable to the first, second and third metallization equally apply to the second, fourth and fifth metallization, respectively. The resulting substrate enables a connection between the first and the fourth metallization with low resistance due to increased width of circuit paths thereon. For example, all circuit paths carrying high load currents can be provided with an increased cross section, which results in a reduced resistance. The design of the substrate allows the use of short bonding means for bonding the second and fourth metallization to the emitters or collectors of the power semiconductors, which increases life-time of the power semiconductor module and reduces its resistance. Coupling of the load current to gate voltages can be reduced, because the third and fifth metallization are surrounded by the second and fourth metallization, similar to a shielded coaxial cable.

The exemplary power semiconductors of the present disclosure can include the above-mentioned power transistors and optionally power diodes. The three metallizations are electrically separated from each other on the substrate. The substrate can have a connection area with contacts for at least the first and second metallization for connection of the substrate. Optionally, the connection area provides an additional contact for the third metallization. The second and third metallization can be bonded to the power semiconductors by bonding means including bonding ribbons and bonding wires. The gate contact and the at least two gate metallization areas can be interconnected with the specified bonding means. The line of the first metallization can be a straight line extending in parallel to an edge of the substrate. Nevertheless, the line can also have a different form and position on the substrate. For example, the first and second metallization can have an L-shape or a U-shape and extend in parallel to each other. According to an exemplary embodiment, the second metallization extends in parallel to the at least one line of the first metallization.

According to an exemplary embodiment of the present disclosure, that the first metallization includes two interconnected lines extending along opposite edges of the substrate, and the second metallization extends in an area between the two lines of the first metallization. The second metallization can be provided as a uniform area for connection of all semiconductors of the two lines. Accordingly, a further improvement can be achieved, because a current through power semiconductors of each line of the first metallization can flow over the entire width of the second metallization. Also bonding of the power semiconductors to the second metallization can be easily realized due to improved usage of the surface of the substrate.

According to another exemplary embodiment, the first metallization is provided in a U-shape and extends through a connection area of the substrate. The connection area provides contacts for at least the first and second metallization for connection of the substrate. Optionally, the connection area provides an additional contact for the third metallization. With the U-shape, the first metallization extends along three edges of the substrate and can easily be manufactured on the substrate.

According to yet another exemplary embodiment, it is conceivable, that at least one gate metallization area is located centrally between the gate contact pads of power transistors of the two lines. This allows connecting the gate contact pads and the at least one gate metallization area using bonding means with a short length, which facilitates the bonding of the gate pads to the third metallization. Gate pads of power transistors belonging to the two lines can be connected with bonding means having the same length. Also bonding of the emitter or collector pads on top of the power transistors to the second metallization can be improved due to the improved bonding of the gate pads to the at least one gate island. In an exemplary embodiment, the at least one gate metallization area can be located centrally between gate pads of two power transistors.

An exemplary power semiconductor module with such a substrate includes multiple power transistors, which are commonly mounted with their collectors or emitters on the second metallization. The remaining (e.g., other) ones of the emitters or collectors of the power transistors are connected to the fourth metallization, gate pads of the power transistors are connected to the fifth metallization, and the gate contact and the at least two gate metallization areas are interconnected by way of bonding means. This power semiconductor module includes a series connection of two switches, so that it can be used for high voltages. The orientation of the power semiconductors on the second metallization is the same like the orientation of the power semiconductors on the first metallization, e.g., all power semiconductors are mounted either with their collector or emitter on the respective metallization. According to another exemplary embodiment, the same numbers of power transistors can be mounted on the first and second metallization. In yet another exemplary embodiment, the same type of power transistors can be mounted on the first and second metallization. Substrates and power semiconductor modules can comprise further metallizations for providing a further series connection of power semiconductors within one module, whereby the same principles as described apply.

According to an exemplary embodiment of the disclosure the third metallization includes a gate contact, which is interconnectable with the least two gate metallization areas by way of bonding means. The gate contact is used for connection of the third metallization on the substrate. In yet another embodiment disclosed herein, the gate contact is located in a connection area which provides contacts for the first and second metallization for connection of the substrate. According to an exemplary embodiment of the present disclosure, the third metallization can be contacted on the substrate using a bonding means. For example, when mounted in a semiconductor module, the gate metallization areas of the third metallization can be directly contacted with a bonding wire from a respective metallization of an adjacent substrate.

According to an exemplary embodiment of the disclosure, the third metallization includes multiple gate islands. The multiple gate islands can be provided close to each of the gate pads of the power transistors, which facilitates the bonding between the gate pads of the power transistors and the gate metallization areas. Thereby, also the bonding between the power semiconductors and the second metallization is facilitated and improved.

According to yet another modified embodiment of the disclosure, the length of the at least one gate island in a longitudinal direction of the at least one line is smaller than the extension of the power transistors in that direction. Hence, the full width of the second metallization is usable at each of the power semiconductors. As a result, bottlenecks are avoided.

According to another exemplary embodiment of the disclosure, the size of the at least one gate island in a direction perpendicular to the at least one line of the first metallization is between 0.5 mm and 3.0 mm, and in yet another exemplary embodiment, between 1.0 mm and 2.0 mm. With this width of the at least one gate island, the second metallization experiences only a small reduction of size in the direction perpendicular to the at least one line of the first metallization, so that high currents can be carried by the second metallization.

According to an exemplary embodiment of the disclosure, the at least two gate metallization areas are located centrally in the second metallization in respect to a direction perpendicular to the at least one line of the first metallization. In other words, the gate metallization areas are arranged in a central line within the second metallization, which provides the second metallization symmetrically on both sides of the gate metallization areas. Gate pads of power transistor belonging to both lines can be equally connected with bonding means having the same length.

According to yet another exemplary embodiment of the disclosure, the at least two gate metallization areas are each separated from the second metallization by a gap with a width in the range from 0.5 mm to 2.0 mm. A reliable separation of the second and third metallization is provided, which enables small measures of the substrate and the power semiconductors module.

According to an exemplary embodiment of the disclosure one gate metallization area is provided as gate peninsula, which is surrounded on the substrate by the second metallization and an edge of the substrate. At the corner of the substrate, almost no current from power semiconductors located next to the corner has to be transported in the second metallization, so that the peninsula can have only marginal influence on the current flow in the second metallization. In yet another exemplary embodiment, the gate peninsula can be provided at an edge of the substrate perpendicular to the opposite lines.

According to an exemplary embodiment disclosed herein, a resistor is provided on and connected to the gate contact, and the gate metallization areas are bonded to the gate contact via the resistor. The gate resistor can be used to control the dynamic behavior of the power transistor. It can be easily mounted on the gate contact without involving additional space on the substrate.

According to another exemplary embodiment of the disclosure, the second metallization is provided in an L-shape and extends through a connection area of the substrate. The connection area provides contacts for at least the first and second metallization for connection of the substrate. Optionally, the connection area provides an additional contact for the third metallization. With the L-shape, the second metallization extends between along the at least one line of the first metallization and can be easily contacted in the connection area.

According to yet another exemplary embodiment of the disclosure, the power transistors include multiple insulated gate bipolar transistors, and at least one power diode is mounted with one contact on the first metallization and connected with its contact pad for its other contact to the second metallization. This combination of power transistors and power diodes provides a suitable combination of features for power semiconductor modules. In another exemplary embodiment, three IGBTs and two power diode can be mounted on the first metallization.

According to still another exemplary embodiment of the disclosure, the power transistors include reverse conducting insulated gate bipolar transistors. The reverse conducting insulated gate bipolar transistors (RC-IGBT) can be used without power diodes, because they have the functionality of power diodes integrated therein. A single type of power transistors can be used for fitting to the substrate, so that the power semiconductor module can be easily manufactured. In another exemplary embodiment, five RC-IGBTs are provided on each substrate. With the substrates including a fourth and a fifth metallization, three RC-IGBTs are mounted on each of the first and the second metallization.

Figure 2:
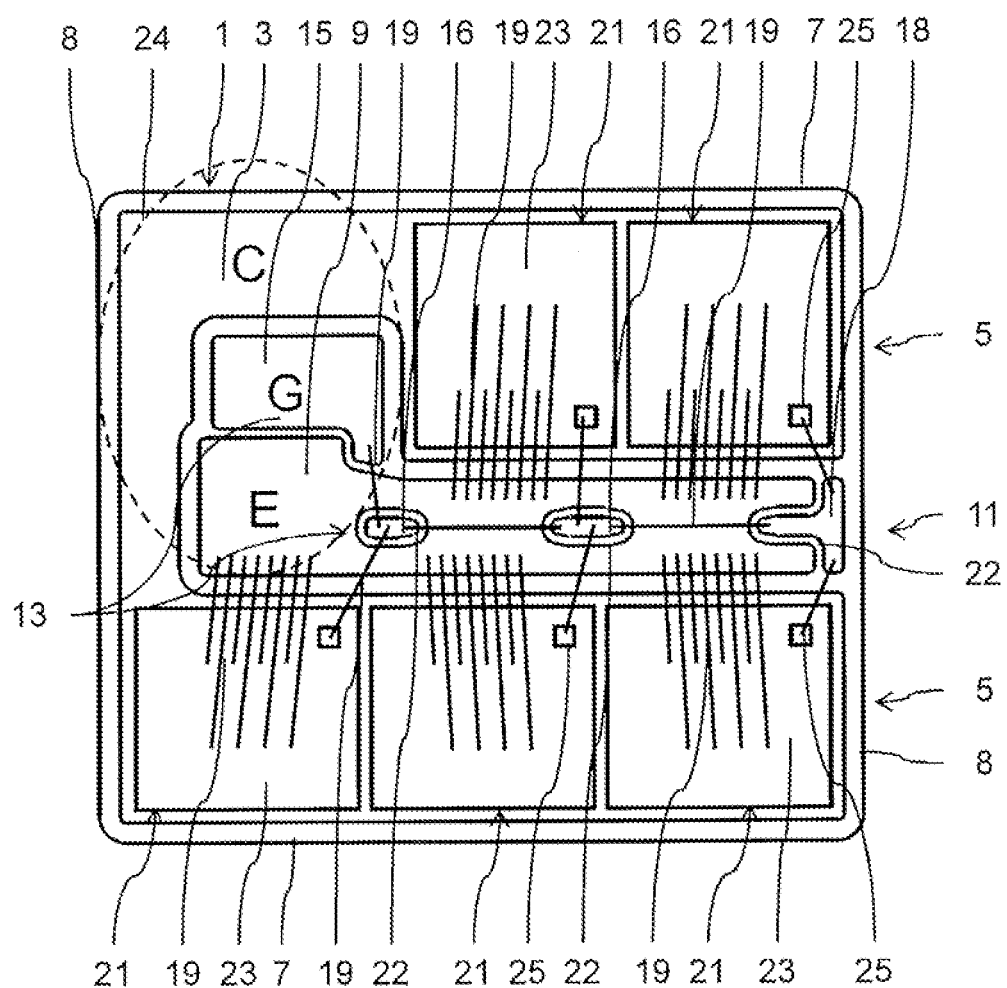
FIG. 2 shows a schematic drawing of a substrate with multiple power transistors mounted thereon according to an exemplary embodiment of the present disclosure.

FIG. 2 shows a schematic drawing of a substrate with multiple power transistors mounted thereon according to an exemplary embodiment of the present disclosure. The substrate 1 includes a first metallization 3 which is provided in a U-shape. Accordingly, the first metallization 3 extends in two interconnected lines 5 extending along opposite edges 7 of the substrate 1 and along one connecting edge 8 connecting the opposite edges 7.

The substrate 1 further includes a second metallization 9, which is provided in an L-shape and extends in an area 11 between the two lines 5 of the first metallization 3.

The substrate 1 also includes a third metallization 13 with an individual gate contact 15 and three separate gate metallization areas 16, 18. The gate metallization areas 16, 18 are arranged between the two lines 5 and spaced apart in a direction parallel to the two lines 5. Two gate metallization areas 16 are provided as gate islands, which are entirely surrounded on the substrate 1 by the second metallization 9. The size of the gate islands 16 in a direction perpendicular to the lines 5 of the first metallization 3 is 2 mm in this embodiment. The third gate metallization area 18 is provided as gate peninsula, which is provided in a T-shape and surrounded on the substrate 1 by the second metallization 9 and a connecting edge 8 of the substrate 1. The gate metallization areas 16, 18 are each separated from the second metallization 9 by a gap 22 with a width of 1.0 mm in this embodiment.

The substrate 1 includes a connection area 24 for contacting the three metallizations 3, 9, 13. Accordingly, the first and second metallization 3, 9 extend through the connection area 24, and the gate contact 15 of the third metallization 13 is positioned in the connection area 24.

As can be seen in FIG. 2, five power transistors 21, which are identical reverse conducting insulated gate bipolar transistors (RC-IGBT) in this embodiment, are commonly mounted with their collectors on the first metallization 3. Emitter pads 23 of the RC-IGBTs 21 are bonded by means of bonding wires 19 to the second metallization 9, and gate pads 25 of the RC-IGBTs 21 are each bonded by means of a single bonding wire 19 to the gate metallization areas 16, 18 of the third metallization 13. On the mounted substrate 1, the gate contact 15, the gate islands 16, and the gate peninsula 18 are interconnected by means of bonding wires 19.

According to FIG. 2, the gate islands 16 and the gate peninsula 18 are located centrally in the second metallization 9 in respect to a direction perpendicular to the two lines 5 of the first metallization 3. The gate islands 16 are further located centrally between gate pads 25 of RC-IGBTs 21 of the opposite lines 5. The length of the gate islands 16 in a longitudinal direction of the two lines 5 is smaller than the respective extension of the RC-IGBTs 21.

A power semiconductor module according to this embodiment, which is not shown in the figures, includes a base plate and multiple substrates 1 mounted thereon. The substrates 1 have an identical shape and design and are identically equipped with the power transistors 5 as described above.

Figure 3:
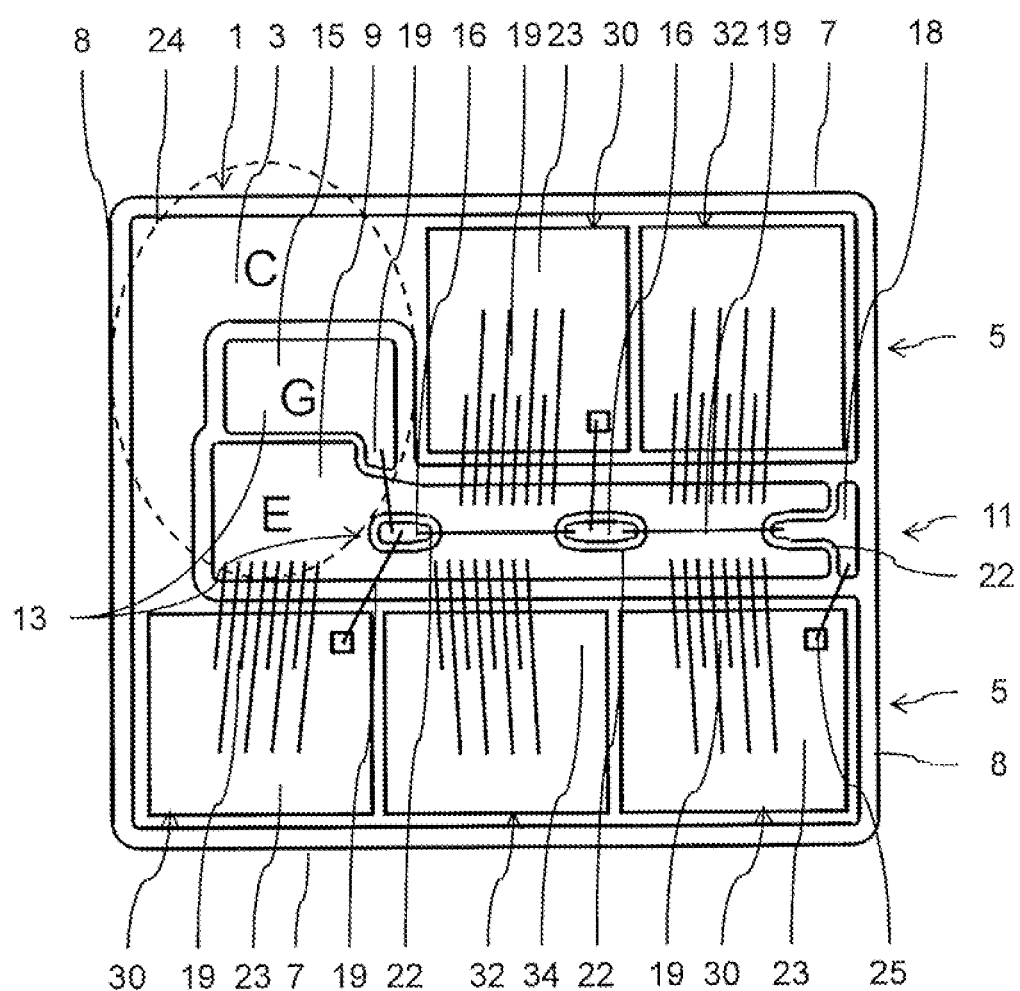
FIG. 3 shows a schematic drawing of a substrate with multiple power transistors and power diodes mounted thereon according to an exemplary embodiment of the present disclosure.

FIG. 3 shows a schematic drawing of a substrate with multiple power transistors and power diodes mounted thereon according to an exemplary embodiment of the present disclosure.

This exemplary embodiment only differs from the exemplary embodiment of FIG. 2 in that different power semiconductors 30, 32 are mounted on the substrate 1. The power semiconductors 30, 32 include three insulated gate bipolar transistors 30 (IGBT) and two power diodes 32. The IGBTs 30 can be mounted and connected the same way like the RC-IGBTs 21 of FIG. 2. The power diodes 32 are mounted with one contact on the first metallization 3 and with a contact pad 34 for the other contact bonded to the second metallization 9. Accordingly, only gate pads 25 of the IGBTs 30 are bonded to the gate islands 16 and the gate peninsula 18.

Figure 4:
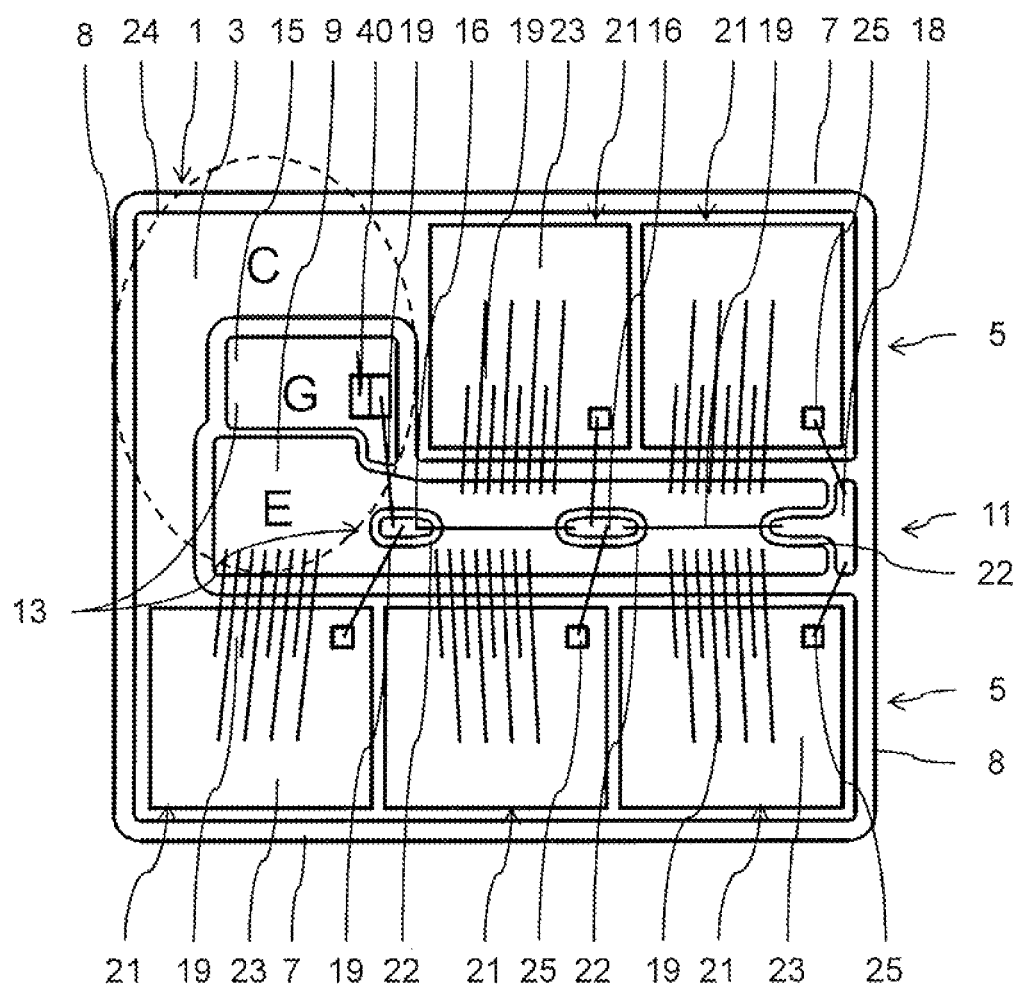
FIG. 4 shows a schematic drawing of a substrate of FIG. 2 with an additional gate resistor according to an exemplary embodiment of the present disclosure.

FIG. 4 shows a schematic drawing of a substrate of FIG. 2 with an additional gate resistor according to an exemplary embodiment of the present disclosure.

The exemplary embodiment of FIG. 4 only differs from the embodiment of FIG. 2 in that a resistor 40 is provided on the gate contact 15 and electrically connected thereto by means of a bonding wire 19. The gate metallization areas 16, 18 are bonded to the gate contact 15 via the resistor 40.

Figure 5:
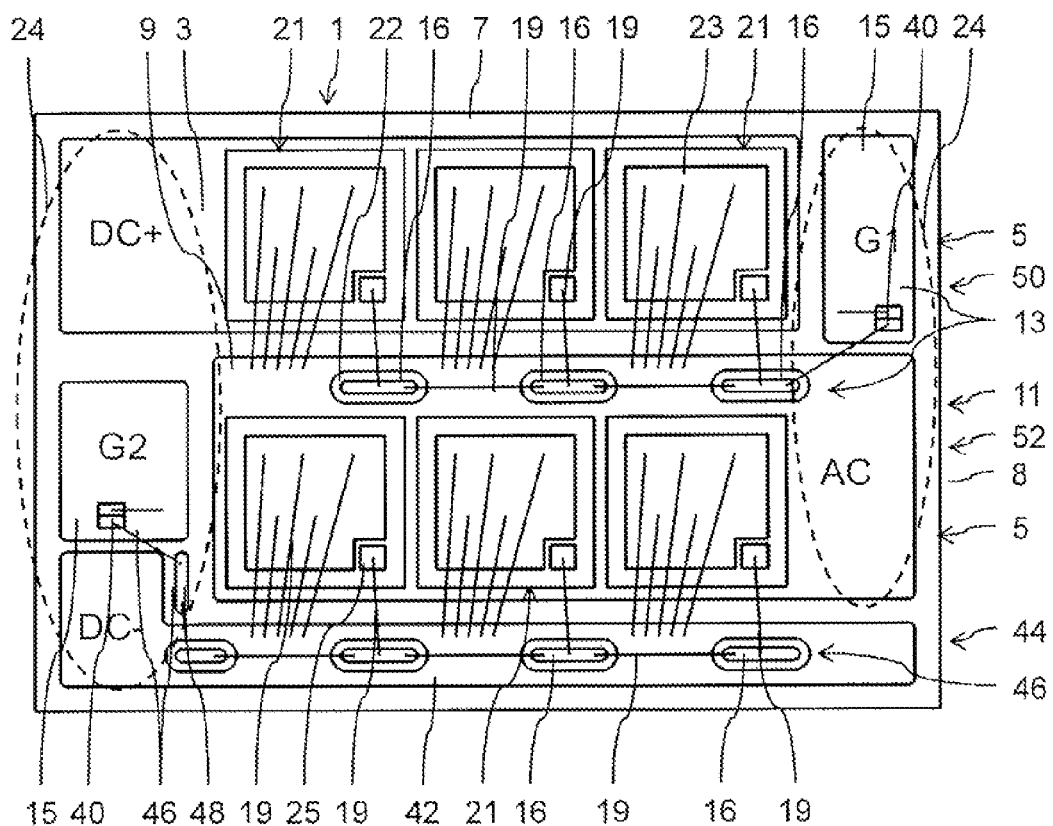
FIG. 5 shows a schematic drawing of a substrate with multiple power transistors mounted thereon in two groups forming two switches arranged in series according to an exemplary embodiment of the present disclosure.

FIG. 5 shows a schematic drawing of a substrate with multiple power transistors mounted thereon in two groups forming two switches arranged in series according to an exemplary embodiment of the present disclosure. Among the Figures, identical reference numerals are used for like components.

As shown in FIG. 5, the substrate 1 includes a first metallization 3 which is provided in a single line 5 extending along an edge 7 of the substrate 1.

The substrate 1 further includes a second metallization 9, which extends in an area 11 along the line 5 of the first metallization 3, and can have a width big enough for mounting power semiconductors thereon.

The substrate 1 also includes a third metallization 13 with an individual gate contact 15 and three separate gate islands 16, which are entirely surrounded on the substrate 1 by the second metallization 9. The size of the gate islands 16 in a direction perpendicular to the line 5 of the first metallization 3 is 2 mm in this embodiment. The gate islands 16 are spaced apart in a direction parallel to the line 5. The gate islands 16 are each separated from the second metallization 9 by a gap 22 with a width of 1.0 mm.

The substrate 1 includes a fourth metallization 42, which can have an L-shape and extends in an area 44 next to the second metallization 3. The substrate 1 further includes a fifth metallization 46 with a gate contact 15, a gate interconnection area 48 and four gate metallization areas 16, which are provided as gate islands and surrounded on the substrate 1 by the fourth metallization 42. The gate islands 16 are interconnected by way of bonding wires 19. The gate islands 16 are arranged in parallel to the lines 5 of the first and second metallization 3, 9 and spaced apart in a longitudinal direction of these lines 5.

On the gate contact 15 of the third and fifth metallization 46 is provided a resistor 40, which is connected thereto by means of a bonding wire 19. The gate islands 16 are bonded to the respective gate contact 15 via the resistor 40.

The substrate 1 includes two connection areas 24 for contacting the metallizations 3, 9, 13, 42, 46. The connection areas 24 are positioned along the connecting edges 8 perpendicular to the lines 5 of the first and second metallizations 3, 9.

As can be further seen in FIG. 5, six power transistors 21, which are identical reverse conducting insulated gate bipolar transistors (RC-IGBT), are commonly mounted with their collectors on the first and second metallization 3, 9. Three RC-IGBTs 21 are mounted on the first metallization 3 and three RC-IGBTs 21 are mounted on the second metallization 9. Emitter pads 23 of the RC-IGBTs 21 are bonded by means of bonding wires 19 to the second and fourth metallization 9, 42, respectively, and gate pads 25 of the RC-IGBTs 21 are each bonded by means of a single bonding wire 19 to gate islands 16 of the third and fifth metallization 13, 46. On the mounted substrate 1, the gate islands 16, the gate contact and the interconnection area are interconnected by means of bonding wires 19. As can be seen in FIG. 5, the gate islands 16 of the third metallization are located centrally in a space of the second metallization 9, which is not covered by the power transistors 21, in respect to a direction perpendicular to the lines 5 of the first and second metallization 3, 9. The gate islands 16 of the fifth metallization are located centrally in a space of the fourth metallization 42 in respect to a direction perpendicular to the lines 5 of the first and second metallization 3, 9.

The RC-IGBTs 21 are arranged on the substrate providing two independent switches 50, 52, a first switch 50 between the first and second metallization 3, 9, and a second switch 52 between the second and fourth metallization 9, 42. The first switch 50 is controlled by via the third metallization 13 and the second switch 52 is controlled via the fifth metallization 46. Accordingly, a control signal provided via the third metallization 13 has to be defined in respect to the potential of the second metallization 9, and a control signal provided via the fifth metallization 46 has to be defined in respect to the potential of the fourth metallization 44.

A power semiconductor module according to the exemplary embodiments of the present disclosure, which is not shown in the figures, can include a base plate and multiple substrates 1 mounted thereon. The substrates 1 can have an identical shape and design and are identically equipped with the power transistors 5 as described above.

While the disclosure has been illustrated and described in detail in the drawings and foregoing description, such illustration and description are to be considered illustrative or exemplary and not restrictive; the disclosure is not limited to the disclosed exemplary embodiments. Other variations to be disclosed exemplary embodiments can be understood and effected by those skilled in the art in practicing the claimed disclosure, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE SIGNS LIST

1 substrate
3 first metallization
5 line
7 edge
8 connecting edge
9 second metallization
11 area between the lines
13 third metallization
15 gate contact
16 gate metallization area, gate island
17 gate area
18 gate metallization area, gate peninsula
19 bonding wire
20 leg
21 power transistor, RC-IGBT
22 gap
23 emitter pad
24 connection area
25 gate pad
30 power transistor, IGBT
32 power diode
34 contact pad
40 resistor
42 fourth metallization
44 area
46 fifth metallization
48 interconnection area
50 first switch
52 second switch

What is claimed is:

1. A substrate comprising:
multiple power transistors mounted thereon;
a first metallization, on which the power transistors are commonly mountable with their collector or emitter, and which extends in at least one line on the substrate;
a second metallization, which extends in an area next to the at least one line of the first metallization, for connection to other ones of the emitters or collectors of the power transistors; and
a third metallization for connection to gate contact pads of the power transistors, wherein the third metallization includes at least two gate metallization areas, which are interconnectable through bonding means, whereby the gate metallization areas are arranged in parallel to the at least one line and spaced apart in a longitudinal direction of the at least one line;
at least one gate metallization area is provided as a gate island surrounded on the substrate by the second metallization, wherein the second metallization is adapted for mounting multiple power transistors with their collectors or emitters thereon, whereby the power transistors have the same orientation like the power transistors mounted on the first metallization;

a fourth metallization, which extends in an area next to the second metallization, for connection to the other ones of the emitters or collectors of the power transistors mountable on the second metallization; and a fifth metallization for connection to gate contact pads of the power transistors mountable on the second metallization, wherein the fifth metallization includes at least two gate metallization areas, which are interconnectable by way of bonding means, and the at least two gate metallization areas are arranged in parallel to the at least one line and spaced apart in a longitudinal direction of the at least one line; and at least one gate metallization area is provided as a gate island surrounded on the substrate by the fourth metallization.

2. The substrate according to claim 1, wherein the third metallization comprises a gate contact, which is interconnectable with the at least two gate metallization areas by way of bonding means.

3. The substrate according to claim 1, wherein the length of the at least one gate island in a longitudinal direction of the at least one line is smaller than the extension of the power transistors in that direction.

4. The substrate according to claim 1, wherein the size of the at least one gate island in a direction perpendicular to the at least one line of the first metallization is between 0.5 mm and 3.0 mm.

5. The substrate according to claim 1, wherein the size of the at least one gate island in a direction perpendicular to the at least one line of the first metallization is between 1.0 mm and 2.0 mm.

6. The substrate according to claim 1, wherein the at least two gate metallization areas are located centrally in the second metallization in respect to a direction perpendicular to the at least one line of the first metallization.

7. The substrate according to claim 1, wherein the at least two gate metallization areas are each separated from the second metallization by a gap with a width in the range from 0.5 mm to 2.0 mm.

8. The substrate according to claim 1, wherein one gate metallization area is provided as gate peninsula, which is surrounded on the substrate by the second metallization and an edge of the substrate.

9. The substrate according to claim 1, wherein the second metallization is provided in an L-shape and extends through a connection area of the substrate.

10. The substrate according to claim 1, wherein a resistor is provided on and connected to the gate contact, and the gate metallization areas are bonded to the gate contact via the resistor.

11. A power semiconductor module comprising:
at least one substrate according to claim 1,
wherein multiple power transistors are commonly mounted with associated collectors or emitters on the first metallization of the at least one substrate,
wherein other emitters or collectors of the power transistors are connected to the second metallization,
wherein gate pads of the power transistors are connected to the third metallization, and
the gate contact and the at least two gate metallization areas are interconnected by way of bonding means.

12. The power semiconductor module according to claim 11,
wherein multiple power transistors are commonly mounted with their collectors or emitters on the second metallization,
wherein other emitters or collectors of the power transistors are connected to the fourth metallization,
wherein gate pads of the power transistors are connected to the fifth metallization, and
wherein the gate contact and the at least two gate metallization areas are interconnected by way of bonding means.

13. The substrate according to claim 1, wherein the at least two gate metallization areas of the third metallization are directly interconnectable through bonding means.

14. The substrate according to claim 1, wherein the at least two gate metallization areas of the fifth metallization are directly interconnectable through the bonding means.

* * * * *